United States Patent
Sato et al.

(10) Patent No.: US 9,964,851 B2
(45) Date of Patent: May 8, 2018

(54) RESIST PATTERN FORMING METHOD AND DEVELOPER FOR LITHOGRAPHY

(71) Applicant: TOKYO OHKA KOGYO CO., LTD., Kawasaki-shi (JP)

(72) Inventors: Kazufumi Sato, Kawasaki (JP); Mitsuo Hagihara, Kawasaki (JP); Tomoya Kumagai, Kawasaki (JP); Masahito Yahagi, Kawasaki (JP); Kenta Suzuki, Kawasaki (JP); Takayoshi Mori, Kawasaki (JP); Ryoji Watanabe, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 0 days. days.

(21) Appl. No.: 15/241,519

(22) Filed: Aug. 19, 2016

(65) Prior Publication Data
US 2017/0059994 A1 Mar. 2, 2017

(30) Foreign Application Priority Data
Aug. 26, 2015 (JP) ................. 2015-167116

(51) Int. Cl.
G03F 7/32 (2006.01)
G03F 7/20 (2006.01)

(52) U.S. Cl.
CPC ............ G03F 7/322 (2013.01); G03F 7/2059 (2013.01)

(58) Field of Classification Search
CPC ............... G03F 7/322; G03F 7/2059
USPC ........................................ 430/325
See application file for complete search history.

(56) References Cited

U.S. PATENT DOCUMENTS 6,790,580 B2 * 9/2004 Takechi ................ G03F 7/0045
430/176
2014/0205950 A1 * 7/2014 Kim ..................... G03F 7/0388
430/285.1

FOREIGN PATENT DOCUMENTS

JP A-2011-145561 7/2011

* cited by examiner

*Primary Examiner* — Daborah Chacko-Davis
(74) *Attorney, Agent, or Firm* — Knobbe Martens Olson & Bear LLP

(57) ABSTRACT

A method of forming a resist pattern including forming a resist film on a support using a resist composition; subjecting the resist film to exposure; and forming a resist pattern by developing the resist film having undergone the exposure, in which the developing is performed using a developer which contains a basic compound represented by the following formula (1) and tetrabutylammonium hydroxide, and in which the concentration of tetrabutylammonium hydroxide is equal to or greater than 2.5% by mass and less than 2.8% by mass:

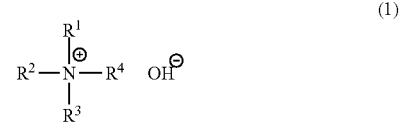

(1)

in which $R^1$ to $R^4$ each independently represent a linear or branched alkyl group, and the total number of carbon atoms contained in each of the alkyl groups represented by $R^1$ to $R^4$ is 4 to 15.

2 Claims, No Drawings

RESIST PATTERN FORMING METHOD AND DEVELOPER FOR LITHOGRAPHY

RELATED APPLICATION

This application claims priority to Japanese Patent Application No. 2015-167116, filed Aug. 26, 2015, the content of which is incorporated herein by reference.

BACKGROUND OF THE INVENTION

Field of the Invention

The present invention relates to a resist pattern forming method and a developer for lithography.

Description of Related Art

In lithography techniques, for example, a method is performed in which a resist film composed of a resist material is formed on a substrate, the resist film is subjected to selective exposure using light or radiation such as electron beams through a mask in which a predetermined pattern is formed, and a development treatment is performed such that a resist pattern having a predetermined shape is formed on the resist film.

A resist material in which a portion having undergone exposure turns into a portion having a property of being dissolved in a developer is referred to as a positive resist, and a resist material in which a portion having undergone exposure turns into a portion having a property of not being dissolved in a developer is referred to as a negative resist.

In recent years, in manufacturing of semiconductor devices or liquid crystal display devices, with the progress of lithography techniques, patterns have rapidly become finer.

For making a fine pattern, generally, a method of shortening the wavelength (increasing the energy) of an exposure light source is performed. Specifically, although ultraviolet rays represented by g-line and i-line were used in the related art, currently, mass production of semiconductor devices by using a KrF excimer laser or an ArF excimer laser has begun. Furthermore, due to these excimer lasers, short-wavelength (high-energy) electron beams, extreme ultraviolet (EUV), X-rays, and the like are also being investigated.

The development treatment in the resist pattern forming method described above is performed by alkaline development using an alkaline solution or organic solvent development using an organic solvent.

In the alkaline development, generally, an aqueous solution of tetramethylammonium hydroxide (hereinafter, described as "TMAH" in some cases) is used. In recent years, the use of an aqueous solution of tetrabutylammonium hydroxide (hereinafter, described as "TBAH" in some cases) has also been suggested.

Japanese Unexamined Patent Application, First Publication No. 2011-145561 discloses a developer for lithography, investigated in the past by the inventors of the present invention, containing an aqueous solution of TMAH and an aqueous solution of TBAH.

SUMMARY OF THE INVENTION

In order to form a finer pattern, the pattern-forming process or the pattern-forming material need to be further improved.

For example, in a case where an ultrafine pattern having a line width of 25 nm to 50 nm is formed using electron beams (EB) or extreme ultraviolet (EUV) as an exposure light source, the solubility of the resist material in a developer affects the resolving power or lithography margin (for example, margin with respect to an exposure amount (EL margin)) in forming a resist pattern.

The present invention has been made in consideration of the above circumstances, and an object thereof is to provide a resist pattern forming method that can form a finer pattern.

As a result of conducting intensive investigation, the inventors of the present invention found that the use of a specific developer increases the solubility of a resist material in the developer and improves resolving power or lithography margin in forming a resist pattern, and accomplished the present invention.

A first aspect of the present invention is a resist pattern forming method including step 1 of forming a resist film on a support by using a resist composition, step 2 of subjecting the resist film to exposure, and step 3 of forming a resist pattern by developing the resist film having undergone the exposure, in which the developing in step 3 is performed using a developer which contains (A) a basic compound represented by the following Formula (1) and (B) tetrabutylammonium hydroxide and in which the concentration of (B) is equal to or greater than 2.5% by mass and less than 2.8% by mass.

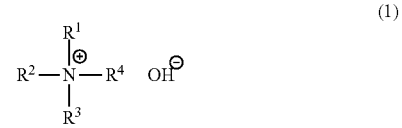

[In Formula (1), $R^1$ to $R^4$ each independently represent a linear or branched alkyl group, and the total number of carbon atoms contained in each of the alkyl groups represented by $R^1$ to $R^4$ is 4 to 15.]

A second aspect of the present invention is a developer for lithography containing (A) a basic compound represented by the following Formula (1) and (B) tetrabutylammonium hydroxide, in which the concentration of (B) is equal to or greater than 2.5% by mass and less than 2.8% by mass.

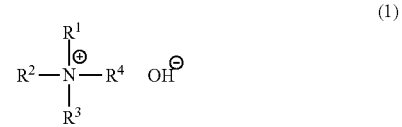

[In Formula (1), $R^1$ to $R^4$ each independently represent a linear or branched alkyl group, and the total number of carbon atoms contained in each of the alkyl groups represented by $R^1$ to $R^4$ is 4 to 15.]

According to the present invention, it is possible to provide a resist pattern forming method that can form a finer pattern.

DETAILED DESCRIPTION OF THE INVENTION

<Resist Pattern Forming Method>

The resist pattern forming method as the first aspect of the present invention will be described.

The resist pattern forming method of the present invention has step 1 of forming a resist film on a support by using a resist composition, step 2 of subjecting the resist film to exposure, and step 3 of forming a resist pattern by developing the resist film having undergone the exposure.

[Step 1]

In step 1, a resist film is formed on a support by using a resist composition.

In step 1, a support is coated with a resist composition, which will be described later, by using a spinner or the like, and a baking (post application baking (PAB)) treatment is performed for 40 to 120 seconds and preferably for 60 to 90 seconds under a temperature condition of, for example, 80° C. to 150° C.

The support is not particularly limited and those known in the related art can be used. Examples thereof include substrates for electronic parts, substrates for electronic parts on which a predetermined wiring pattern is formed, and the like. More specifically, examples thereof include a silicon wafer, a substrate made of a metal such as copper, chromium, iron, or aluminum, a glass substrate, and the like. As a material for the wiring pattern, for example, copper, aluminum, nickel, and gold can be used.

Furthermore, the aforementioned substrate on which either or both of an inorganic film and organic film are provided may be used as the support. Examples of the inorganic film include an inorganic antireflection film (inorganic BARC). Examples of the organic film include organic films such as an organic antireflection film (organic BARC) and a lower layer organic film in a multilayer resist method.

The multilayer resist method is a method in which at least one layer of organic film (lower layer organic film) and at least one layer of resist film (upper layer resist film) are provided on a substrate, and the lower layer organic film is subjected to patterning by using a resist pattern formed on the upper layer resist film as a mask. The multilayer resist method is considered to be able to form a pattern with a high aspect ratio. That is, according to the multilayer resist method, an intended thickness can be secured due to the lower layer organic film, and accordingly, the resist film can be thinned, and a fine pattern with a high aspect ratio can be formed.

The multilayer resist method is basically classified into a method (double layer resist method) adopting a double layer structure consisting of an upper layer resist film and a lower layer resist film and a method (triple layer resist method) adopting a multilayer structure consisting of three or more layers in which one or more interlayers (thin metal films or the like) are provided between an upper layer resist film and a lower layer organic film.

[Step 2]

Step 2 is a step of subjecting the resist film obtained in the first step to exposure.

In step 2, for example, by using an exposure device such as an ArF exposure device, an electron beam lithography device, or an EUV exposure device, the resist film obtained in step 1 is subjected to exposure through a mask (mask pattern) on which a predetermined pattern is formed or subject to selective exposure through lithography or the like by being directly irradiated with electron beams without the intervention of a mask pattern, and then a baking (post exposure baking (PEB)) treatment is performed for 40 to 120 seconds and preferably for 60 to 90 seconds under a temperature condition of, for example, 80° C. to 150° C.

The wavelength used for exposure is not particularly limited, and radiation such as an ArF excimer laser, a KrF excimer laser, a $F_2$ excimer laser, extreme ultraviolet (EUV), vacuum ultraviolet (VUV), electron beams (EB), X-rays, and soft X-rays can be used. In a case where exposure is performed using an electron beam lithography device or an EUV exposure device and using EB or EUV among the above, the resist pattern forming method of the present invention is particularly useful.

The exposure method of the resist film may be general exposure (dry exposure) performed in the air or an inert gas such as nitrogen or may be liquid immersion lithography.

The liquid immersion lithography is an exposure method in which a space between a resist film and a lens in a lowermost position of an exposure device is filled in advance with a solvent (liquid immersion medium) having a refractive index greater than a refractive index of the air, and exposure (immersion exposure) is performed in this state.

As the liquid immersion medium, a solvent is preferable which has a refractive index that is greater than a refractive index of the air but is lower than a refractive index of the resist film subjected to exposure. The refractive index of the solvent is not particularly limited as long as it is within the range described above.

Examples of the solvent, which has a refractive index that is greater than a refractive index of the air but is lower than a refractive index of the resist film, include water, a fluorine-based inert liquid, a silicon-based solvent, a hydrocarbon-based solvent, and the like.

Specific examples of the fluorine-based inert liquid include liquids containing a fluorine-based compound such as $C_3HCl_2F_5$, $C_4F_9OCH_3$, $C_4F_9OC_2H_5$, or $C_5H_3F_7$ as a main component, and the like. The boiling point of the fluorine-based inert liquid is preferably 70° C. to 180° C., and more preferably 80° C. to 160° C. It is preferable that the boiling point of the fluorine-based inert liquid is within the above range, because then the medium used for liquid immersion can be removed by a simple method after the exposure is finished.

As the fluorine-based inert liquid, particularly, a perfluoroalkyl compound in which all of the hydrogen atoms of an alkyl group are substituted with a fluorine atom is preferable. Specific examples of the perfluoroalkyl compound include a perfluoroalkylether compound and a perfluoroalkylamine compound.

Specifically, examples of the perfluoroalkylether compound include perfluoro(2-butyl-tetrahydrofuran) (boiling point: 102° C.), and examples of the perfluoroalkylamine compound include perfluorotributylamine (boiling point: 174° C.).

From the viewpoint of cost, safety, environmental issue, versatility, and the like, water is preferably used as the liquid immersion medium.

[Step 3]

Step 3 is a step of forming a resist pattern by developing the resist film having undergone the exposure.

The development treatment in step 3 is performed using a developer for lithography which contains (A) a basic compound represented by Formula (1) and (B) tetrabutylammonium hydroxide and in which the concentration of (B) is equal to or greater than 2.5% by mass and less than 2.8% by mass. The concentration of the developer for lithography is the concentration at the time when the developer is used in the developing treatment. The developer used in step 3 will be specifically described in the second aspect of the present invention that will be described later.

The development time is preferably 5 to 120 seconds, and more preferably 10 to 100 seconds.

The development temperature may be the internal temperature of a clean room in which mass production of a semiconductor device is performed, and the temperature of the developer for lithography is preferably 10° C. to 30° C., and more preferably 15° C. to 25° C.

It is preferable to perform a rinsing treatment after the development treatment. In a case of alkaline development process, the rinsing treatment is preferably rinsing with water using pure water. In a case of solvent development process, it is preferable to use a rinsing solution containing an organic solvent.

After the development treatment or the rinsing treatment, drying is performed. Furthermore, in some cases, a baking treatment (post-baking) may be performed after the development treatment. In this way, a resist pattern can be obtained.

The development treatment can be performed by a known development method. Examples of the method include a method of dipping a support in a developer for a certain period of time (dipping method), a method of heaping a developer on the surface of a support by exploiting surface tension and allowing the developer stand still for a certain period of time (paddle method), a method of spraying a developer to the surface of a support (spray method), a method of continuously ejecting a developer onto a support, which is rotating at a certain rate, while scanning a developer-ejecting nozzle at a certain rate (dynamic dispense method), and the like.

The rinsing treatment (washing treatment) using a rinsing solution can be performed by a known rinsing method. Examples of the method include a method of continuously ejecting a rinsing solution onto a support which is rotating at a certain rate (rotary coating method), a method of dipping a support in a rinsing solution for a certain period of time (dipping method), a method of spraying a rinsing solution to the surface of a support (spray method), and the like.

If the resist pattern forming method as the first aspect has a step of performing development by using a predetermined developer, the solubility of the resist film in the developer can be improved, a high-resolution resist pattern excellent in lithography margin can be formed.

In the present invention, even in a case where an ultrafine pattern having a line width of 25 to 50 nm and particularly having a line width of 25 to 32 nm is formed particularly using an exposure device such as an electron beam lithography device or an EUV exposure device, a high-resolution resist pattern can be formed, and the formed resist pattern can be excellent in lithography margin.

<Developer for Lithography>

The developer for lithography as the second aspect of the present invention contains (A) a basic compound represented by Formula (1) and (B) tetrabutylammonium hydroxide.

The developer for lithography of the present invention is used in the development treatment for dissolving and removing an alkali-soluble portion from the resist film, after the resist film is subjected to exposure using radiation such as ultraviolet rays or electron beams. By going through the development treatment described above, the resist film becomes a resist pattern having a predetermined pattern shape.

In the developer for lithography of the present invention, the concentration of tetrabutylammonium hydroxide is set to be a predetermined value. Therefore, the solubility of an alkali-soluble portion of the resist film can be improved, a high-resolution resist pattern can be formed, and the formed resist pattern can be excellent in lithography margin.

Examples of the developer for lithography of the present invention include one-liquid type and two-liquid type developers which will be described later. The developer for lithography of the present invention contains (A) a basic compound represented by Formula (1) and (B) tetrabutylammonium hydroxide, in which the concentration of (B) is equal to or greater than 2.5% by mass and less than 2.8% by mass. The concentration of the developer for lithography is a concentration at the time when the developer is used in the development treatment.

[(A) Basic Compound]

The basic compound contained in the developer for lithography as the second aspect will be described.

The developer for lithography as the second aspect contains a basic compound represented by the following Formula (1) (hereinafter, described as a "component (A)" in some cases).

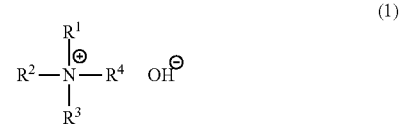

(1)

[In Formula (1), $R^1$ to $R^4$ each represents a linear or branched alkyl group, and the total number of carbon atoms contained in each of $R^1$ to $R^4$ is 4 to 15.]

In the above Formula (1), $R^1$ to $R^4$ each represents a linear or branched alkyl group. The total number of carbon atoms contained in each of $R^1$ to $R^4$ is 4 to 15. If the total number of carbon atoms is equal to or less than 15, the water solubility of the component (A) is maintained, and the precipitation of the component (A) in the developer can be inhibited. The total number of carbon atoms contained in each of $R^1$ to $R^4$ is preferably 4 to 12, and more preferably 4 to 8.

Examples of the component (A) include dipentyldimethyl ammonium hydroxide, dipentylethylmethylammonium hydroxide, dipentyldiethylammonium hydroxide, dipentylethylpropylammonium hydroxide, tributylethylammonium hydroxide, tributylpropylammonium hydroxide, tributylmethylammonium hydroxide, dibutyldimethylammonium hydroxide, dibutylmethylethylammonium hydroxide, dibutyldiethylammonium hydroxide, dibutylethylpropylammonium hydroxide, dibutyldipropylammonium hydroxide, tetrapropylammonium hydroxide, tripropylpentylammonium hydroxide, tripropylbutylammonium hydroxide, tripropylethylammonium hydroxide, tripropylmethylammonium hydroxide, dipropylbutylethylammonium hydroxide, dipropylbutylmethylammonium hydroxide, tetraethylammonium hydroxide, triethylpentylammonium hydroxide, triethylbutylammonium hydroxide, triethylpropylammonium hydroxide, triethylmethylammonium hydroxide, diethyldimethylammonium hydroxide, tetramethylammonium hydroxide, and the like. Among these, in view of availability, tetrapropylammonium hydroxide, tetraethylammonium hydroxide, and tetramethylammonium hydroxide are preferably used as the component (A). One kind of these may be used singly, or two or more kinds thereof may be used in combination.

The concentration of the component (A) in the developer for lithography is not particularly limited, and is preferably equal to or greater than 1.0% by mass and equal to or less than 5.0% by mass. If the content of the component (A) in the developer for lithography is equal to or greater than 1.0% by mass, sufficient solubility of the alkali-soluble portion of the resist film can be obtained.

The concentration of the component (A) in the developer for lithography is more preferably equal to or greater than 1.2% by mass and equal to or less than 1.7% by mass, and most preferably equal to or greater than 1.3% by mass and equal to or less than 1.6% by mass.

[(B) tetrabutylammonium hydroxide]

In the developer for lithography as the second aspect, tetrabutylammonium hydroxide (TBAH) used as the component (B) imparts alkalinity, which is necessary for developing the resist film having undergone the exposure treatment, to the developer for lithography. If the resist film is a positive resist insoluble in an alkali in an unexposed state, an exposed portion thereof turns into an alkali-soluble portion. If the resist film is a negative resist soluble in an alkali in an unexposed state, an exposed portion thereof turns into an alkali-insoluble portion. Therefore, by treating the resist film with the alkaline developer for lithography after the exposure, the alkali-insoluble site remains as a resist pattern. In order to impart alkalinity necessary for the treatment to the developer for lithography, the component (B) is added to the developer.

In the present invention, the content of the component (B) in the developer for lithography is equal to or greater than 2.5% by mass and less than 2.8% by mass.

If the content of the component (B) in the developer for lithography is equal to or greater than 2.5% by mass, alkalinity can be imparted to the developer for lithography, and the solubility of an alkali-soluble portion of the resist film having undergone the exposure treatment can be improved. If the content of the component (B) in the developer for lithography is less than 2.8% by mass, excellent lithography margin can be obtained.

The content of the component (B) in the developer for lithography is more preferably equal to or greater than 2.55% by mass and equal to or less than 2.79% by mass, and most preferably equal to or greater than 2.60% by mass and equal to or less than 2.78% by mass.

A ratio between the content of the component (A) and the content of the component (B) is preferably component (A):component (B)=1:1.5 to 1:1.8, and more preferably component (A):component (B)=1:1.55 to 1:1.75, in terms of a mass ratio. If the ratio between the content of the component (A) and the content of the component (B) is within the above range, the solubility of an alkali-soluble portion of the resist film in the developer can be improved.

[Optional Component]

The developer for lithography of the present invention may contain optional components in addition to the components (A) and (B) described above. Examples of the optional components include a solubilizing adjuvant component and the like.

(C) solubilizing Adjuvant Component

To the developer for lithography of the present invention, as a component (C), a solubilizing adjuvant component may be added. Examples of the component (C) include at least one component selected from the group consisting of (C1) a water-soluble organic solvent, (C2) a surfactant, and (C3) a clathrate compound. If the component (C) is added to the developer for lithography, the solubility of the component (B) is increased, and the precipitation of the component (B) in the developer can be prevented.

To the developer for lithography of the present invention, components other than the aforementioned components (A) to (C) may be added as other components. Examples of the components other than the components (A) to (C) that are used in the developer for lithography of the present invention include water. From the viewpoint of preventing a phenomenon in which the yield of the prepared semiconductor device is reduced due to impurities such as a metal salt contained in the developer for lithography, water to be used is preferably highly purified water such as deionized water or distilled water.

In the developer for lithography of the present invention, the content of halogen is preferably equal to or less than 10 ppm, and more preferably equal to or less than 1 ppm. Examples of halogen include bromine and chlorine. If the content of halogen is within the above range, the yield of the manufactured semiconductor device can be improved.

In the developer for lithography of the present invention, the content of metal ions is preferably equal to or less than 100 ppb, and more preferably equal to or less than 10 ppb. If the content of metal ions is within the above range, the yield of the manufactured semiconductor device can be improved.

In the developer for lithography of the present invention, the content of carbonate ions is preferably equal to or less than 1% by mass, and more preferably equal to or less than 0.1% by mass. If the content of carbonate ions is within the above range, developability can be excellently maintained.

[Method of Preparing Developer for Lithography]

The developer for lithography of the present invention is prepared by mixing the aforementioned respective components together.

The method of mixing the aforementioned respective components described above together is not particularly limited.

Examples of the developer for lithography of the present invention include a one-liquid type developer and a two-liquid type developer. The one-liquid type developer may be, for example, an aqueous solution, which contains the component (A) in an amount of equal to or greater than 1.0% by mass and equal to or less than 5.0% by mass and the component (B) in an amount of equal to or greater than 2.5% by mass and less than 2.8% by mass, or a developer obtained by concentrating the above aqueous solution.

Examples of the two-liquid type developer include a developer obtained by preparing an aqueous solution of (A) and an aqueous solution of (B) separately and mixing them together at the time of the development treatment such that at least the concentration of (B) becomes equal to or greater than 2.5% by mass and less than 2.8% by mass.

According to the developer for lithography of the present invention, at the time of developing the resist film having undergone selective exposure, the solubility of an alkali-soluble portion of the resist film can be improved. Therefore, the developer for lithography is preferably used when a semiconductor device having a line with of less than 50 nm is manufactured by a lithography processing. Especially, even in a case where an ultrafine pattern having a line width of 25 to 50 nm and particularly having a line width of 25 to 32 nm is formed using an exposure device such as an electron beam lithography device or an EUV exposure device, a high-resolution resist pattern can be formed, and the formed resist pattern can be excellent in lithography margin.

<Resist Composition>

A resist composition that can be suitably used in the resist pattern forming method of the present invention will be described.

As the resist composition that can be suitably used in the resist pattern forming method of the present invention, various known resist compositions can be used without particular limitation.

Particularly, examples of the resist composition that can be suitably used in the resist pattern forming method of the present invention include a resist composition containing a base component, an acid generating component, and an organic solvent component.

[Base Component]

In the present invention, the base component contained in the resist composition preferably has a structural unit containing an acid-decomposable group whose polarity is increased by the action of an acid (hereinafter, referred to as a "structural unit (a1)"), a structural unit having a $-SO_2$-containing cyclic group, a lactone-containing cyclic group, a carbonate-containing cyclic group, or a heterocyclic group other than these (hereinafter, referred to as a "structural unit (a2)"), a structural unit (st), and the like.

(Structural Unit (a1))

The structural unit (a1) is a constituent unit containing an acid-decomposable group whose polarity is increased by the action of an acid.

The "acid-decomposable group" is a group decomposed by an acid, in which at least one of the bonds in the structure of the acid-decomposable group can be cleaved by the action of an acid.

Examples of the acid-decomposable group whose polarity is increased by the action of an acid include a group generating a polar group by being decomposed by the action of an acid.

Examples of the polar group include a carboxy group, a hydroxyl group, an amino group, a sulfo group ($-SO_3H$), and the like. Among these, a polar group containing $-OH$ in the structure thereof is preferable (hereinafter, referred to as an "OH-containing polar group" in some cases). As the OH-containing polar group, a carboxy group or a hydroxyl group is preferable, and a carboxy group is particularly preferable.

More specific examples of the acid-decomposable group include a group in which the aforementioned polar group is protected with an acid-dissociable group (for example, a group in which a hydrogen atom of an OH-containing polar group is protected with an acid-dissociable group).

The base component may have one kind of structural unit (a1) or two or more kinds thereof.

The proportion of the structural unit (a1) in the base component is preferably 1 to 80 mol %, more preferably 5 to 75 mol %, and even more preferably 7 to 70 mol %, with respect to the total of the structural units constituting the base component. If the proportion of the structural unit (a1) is equal to or greater than the lower limit described above, lithography characteristics such as sensitivity, resolution, and LWR are also improved. If the proportion of the structural unit (a1) is equal to or less than the upper limit described above, the structural unit (a1) and other structural units can be well balanced.

(Structural Unit (a2))

The structural unit (a2) is a structural unit having a $-SO_2$-containing cyclic group, a lactone-containing cyclic group, a carbonate-containing cyclic group, or a heterocyclic group other than these.

The $-SO_2$-containing cyclic group, the lactone-containing cyclic group, the carbonate-containing cyclic group, or the heterocyclic group other than these contained in the structural unit (a2) are effective for improving the adhesiveness of the resist film to the substrate in a case where the base component is used for forming the resist film.

The base component may contain one kind of structural unit (a2) or two or more kinds thereof.

In a case where the base component has the structural unit (a2), the proportion of the structural unit (a2) is preferably 1 to 80 mol %, more preferably 5 to 70 mol %, even more preferably 10 to 65 mol %, and particularly preferably 10 to 60 mol %, with respect to the total of the structural units constituting the component (A). If the proportion of the structural unit (a2) is equal to or greater than the lower limit described above, the effect that the base component contains the structural unit (a2) is sufficiently obtained. If the proportion of the structural unit (a2) is equal to or less than the upper limit described above, the structural unit (a2) and other structural units can be well balanced, and various lithography characteristics and the pattern shape become excellent.

(Structural Unit (st))

The structural unit (st) is a structural unit derived from hydroxystyrene.

The "hydroxystyrene" has a concept encompassing hydroxystyrene, a compound in which a hydrogen atom bonded to a carbon atom in an α-position of hydroxystyrene is substituted with other substituents such as a halogen atom, an alkyl group, and a halogenated alkyl group, and derivatives of these (suitably, compounds in which the aforementioned substituents are bonded to a benzene ring, and the like). The number of hydroxyl groups bonded to a benzene ring of hydroxystyrene is preferably an integer of 1 to 3, and more preferably 1. Herein, unless otherwise specified, the α-position (carbon atom of the α-position) of hydroxystyrene refers to a carbon atom to which a benzene ring is bonded.

The "structural unit derived from hydroxystyrene" means a structural unit constituted as a result of cleavage of an ethylenic double bond of hydroxystyrene.

The substrate component may have one kind of structural unit (st) or two or more kinds thereof.

The proportion of the structural unit (st) in the base component is preferably 20 to 80 mol %, more preferably 20 to 75 mol %, and even more preferably 25 to 70 mol %, with respect to the total of the structural units constituting the base component. If the proportion of the structural unit (st) is equal to or greater than the lower limit described above, lithography characteristics such as sensitivity, resolution, and LWR are also improved. Furthermore, if the proportion of the structural unit (st) is equal to or less than the upper limit described above, the structural unit (st) and other structural units can be well balanced.

The base component is preferably obtained by mixing a copolymer 1 having the structural units (a1) and (a2) with a copolymer 2 having the structural units (st) and (a1).

[Acid Generator Component]

In the present invention, the resist composition may contain an acid generator component that generates an acid through exposure. The acid generator component is not particularly limited, and those suggested so far as acid generators for a chemical amplification-type resist can be used.

Examples of such acid generators include various acid generators including an onium salt-based acid generator such as iodonium salt or a sulfonium salt, an oxime sulfonate-based acid generator, diazomethane-based acid generators such as bisalkylsulfonyl or bisarylsulfonyl diazomethanes and poly(bissulfonyl)diazomethanes, a nitrobenzylsulfonate-based acid generator, an iminosulfonate-based acid generator, and a disulfone-based acid generator. Among these, an onium salt-based acid generator is preferably used.

As the acid generator component, one kind of acid generator described above may be used singly, or two or more kinds thereof may be used in combination.

The content of the acid generator component is preferably 0.5 to 60 parts by mass, more preferably 1 to 50 parts by mass, and even more preferably 1 to 40 parts by mass, with respect to 100 parts by mass of the substrate component. If the content of the acid generator component is within the above range, a pattern is sufficiently formed. Furthermore, it is preferable that the content of the acid generator component is within the above range, because then a homogeneous solution is obtained when the respective components of the resist composition are dissolved in an organic solvent, and the storage stability becomes excellent.

[Organic Solvent Component]

In the present invention, the resist composition can be manufactured by dissolving the materials such as the base component or the acid generator component described above in an organic solvent (hereinafter, referred to as a component (S) in some cases).

As the component (S), propylene glycol monomethyl ether acetate (PGMEA), propylene glycol monomethyl ether (PGME), and the like are preferable.

The amount of the component (S) used is not particularly limited, and is appropriately set according to the thickness of a coating film such that the concentration of the resist composition becomes enough for being able to coat a substrate. Generally, the component (S) is used such that the concentration solid contents of the resist composition is within a range of 1 to 20% by mass and preferably within a range of 2 to 15% by mass.

EXAMPLES

Hereinafter, the present invention will be more specifically described based on examples, but the present invention is not limited to the following examples.

[Preparation of Developer for Lithography]

Tetramethylammonium hydroxide (TMAH) and tetrabutylammonium hydroxide (TBAH) as basic compounds were dissolved in pure water at a concentration (% by mass) shown in Table 1, thereby preparing developers for lithography of Examples 1 to 3 and Comparative Examples 1 to 16.

TABLE 1

|  | TMAH | TBAH |
| --- | --- | --- |
| Example 1 | 1.55 | 2.64 |
| Example 2 | 1.55 | 2.72 |
| Example 3 | 1.55 | 2.78 |
| Comparative Example 1 | 2.38 | 0.00 |
| Comparative Example 2 | 1.79 | 1.69 |
| Comparative Example 3 | 1.55 | 2.37 |
| Comparative Example 4 | 1.19 | 3.39 |
| Comparative Example 5 | 0.83 | 4.40 |
| Comparative Example 6 | 0.60 | 5.08 |
| Comparative Example 7 | 0.00 | 6.77 |
| Comparative Example 8 | 1.55 | 2.81 |
| Comparative Example 9 | 1.55 | 3.56 |
| Comparative Example 10 | 1.00 | 5.28 |
| Comparative Example 11 | 0.71 | 6.09 |
| Comparative Example 12 | 1.19 | 3.77 |
| Comparative Example 13 | 1.79 | 1.89 |
| Comparative Example 14 | 1.19 | 3.89 |
| Comparative Example 15 | 1.79 | 1.94 |
| Comparative Example 16 | 1.19 | 0.00 |

[Preparation of Resist Composition]

The respective components shown in Table 2 were mixed and dissolved together, thereby preparing a resist composition.

TABLE 2

|  | Component (A) | | Component (B) | Component (D) | Component (E) | Component (S) |
| --- | --- | --- | --- | --- | --- | --- |
|  | (A)-1 | (A)-2 | (B)-1 | (D)-1 | (E)-1 | (S)-1 |
| Resist composition | [50] | [50] | [14] | [1.5] | [0.64] | [9500] |

Each of the abbreviations in the above Table 2 means the following. The numerical values in the bracket indicate the amount of the component (parts by mass).

(A)-1 and (A)-2: the following polymer compounds 1 and 2

(B)-1: the following compound (B)-1

(D)-1: tri-n-octylamine (E)-1: salicylic acid (S)-1: mixed solvent of PGMEA/PGME (mass ratio: 60/40)

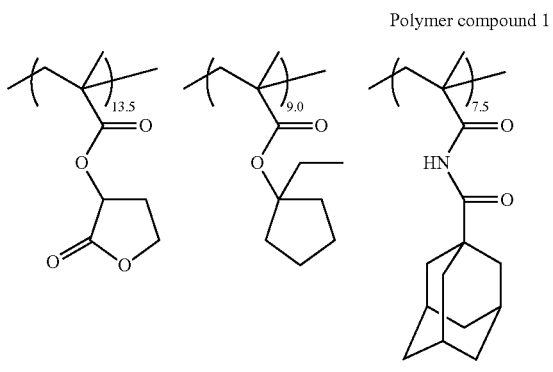

Polymer compound 1

Mw: 6000

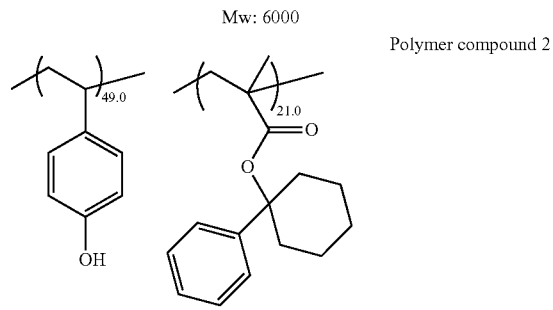

Polymer compound 2

Mw: 6000

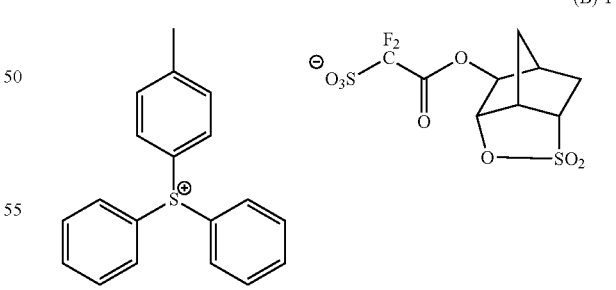

(B)-1

<Formation of Resist Pattern>

A 8-inch silicon substrate treated with hexamethyldisilazane (HMDS) was coated with the aforementioned resist composition by using a spinner and subjected to a prebaking (PAB) treatment on a hot plate under the condition of a temperature of 100° C. for 60 seconds, followed by drying, thereby forming a resist film having a film thickness of 30 nm.

Then, on the resist film, lithography (exposure) was performed using an electron beam lithography device JEOL-JBX-9300FS (manufactured by JEOL Ltd.) at an acceleration voltage of 100 kV such that a 1:1 line and space pattern (hereinafter, referred to as an "LS pattern") having a line width of 50 to 26 nm set as a target size was formed.

Thereafter, the resist film was subjected to a post-exposure heating treatment for 60 seconds at 110° C. (PEB (° C.)).

Subsequently, by using each of the developers of Examples 1 to 3 and Comparative Examples 1 to 16, alkaline development was performed for 60 seconds at 23° C., and then the resist film was rinsed with pure water for 60 seconds.

As a result, even in a case where the developer of any of Examples 1 to 3 and Comparative Examples 1 to 16 was used, a 1:1 LS pattern having a line width of 50 nm was formed respectively.

[Evaluation of Optimal Exposure Amount (Eop)]

The optimal exposure amount Eop ($\mu C/cm^2$) in which the LS pattern having a line width of 50 nm was formed by the aforementioned resist pattern forming method was determined. The results are shown as "sensitivity ($\mu C/cm^2$)" in Table 3.

[Evaluation of Line-Width Roughness (LWR)]

For the LS pattern having a line width of 50 nm formed as above in <Formation of resist pattern>, $3\sigma$ as a measure indicating LWR was determined.

By using a scanning electron microscope (acceleration voltage: 800 V, trade name: S-9380, manufactured by Hitachi High-Technologies Corporation), 400 line positions in the longitudinal direction of lines were measured, and from the measured results, a standard deviation ($\sigma$) was determined. "$3\sigma$" is a value obtained by multiplying the standard deviation by 3 (unit: nm).

The lower the value of $3\sigma$, the smaller the roughness of the side wall of the lines, and this means that an LS pattern with more uniform width has been obtained. The results are shown as "LWR (nm)" in Table 3.

[Evaluation of Exposure Margin]

Within the exposure amount in which the aforementioned LS pattern was formed, an exposure amount at the time when the lines of the LS pattern with a size in a range of a target size ±5% were formed was determined and evaluated according to the following evaluation criteria.

(Evaluation Criteria)

Under Margin O: a resolution shot is equal to or greater than 7% of Eop in 30 nm LS.

Under Margin X: a resolution shot is equal to or less than 7% of Eop in 30 nm LS.

Over Margin O: a resolution shot is equal to or greater than 7% of Eop in 30 nm LS.

Over Margin X: a resolution shot is equal to or less than 7% of Eop in 30 nm LS.

[Evaluation of Shape]

The state of the LS pattern having a line width of 50 nm formed as above in <Formation of resist pattern> was evaluated according to the following evaluation criteria. The results are shown as "shape" in Table 3.

(Evaluation Criteria)

A: a high-resolution LS pattern was formed across the entire substrate.

B: line portions were partially missed, and resolution defectiveness was observed.

TABLE 3

| | TMAH | TBAH | Eop ($\mu c/cm^2$) | Under margin | Over margin | Shape |
|---|---|---|---|---|---|---|
| Example 1 | 1.55 | 2.64 | 124.7 | A | A | A |
| Example 2 | 1.55 | 2.72 | 128.1 | A | A | A |
| Example 3 | 1.55 | 2.78 | 121.2 | A | A | A |
| Comparative Example 1 | 2.38 | 0.00 | 118.8 | A | B | A |
| Comparative Example 2 | 1.79 | 1.69 | 123.4 | B | A | A |
| Comparative Example 3 | 1.55 | 2.37 | 121.7 | B | A | A |
| Comparative Example 4 | 1.19 | 3.39 | 125.4 | B | A | A |
| Comparative Example 5 | 0.83 | 4.40 | 127.7 | B | A | A |
| Comparative Example 6 | 0.60 | 5.08 | 132.5 | B | A | A |
| Comparative Example 7 | 0.00 | 6.77 | 135.3 | B | A | A |
| Comparative Example 8 | 1.55 | 2.81 | 117.4 | B | B | A |
| Comparative Example 9 | 1.55 | 3.56 | 110.5 | B | B | B |
| Comparative Example 10 | 1.00 | 5.28 | 113.2 | A | B | B |
| Comparative Example 11 | 0.71 | 6.09 | 110.5 | A | B | B |
| Comparative Example 12 | 1.19 | 3.77 | 123.6 | B | A | A |
| Comparative Example 13 | 1.79 | 1.89 | 127.4 | A | B | A |
| Comparative Example 14 | 1.19 | 3.89 | 126.3 | B | A | A |
| Comparative Example 15 | 1.79 | 1.94 | 130.2 | A | B | A |
| Comparative Example 16 | 1.19 | 0.00 | >150 | B | A | B |

As is evident from the above results, in a case where the developers of Examples 1 to 3 were used, resist patterns excellent in all of the lithography characteristics such as under margin, over margin, and shape could be formed, although Eop and LWR in Examples 1 to 3 were as equivalent to those in Comparative Examples 1 to 15.

Comparative Example 16 was not resolved, and LWR thereof could not be measured.

In a case where each of the developers of Examples 1 to 3 was used, a 1:1 LS pattern having a line width of 50 to 26 nm was formed respectively as shown in Table 4. In Table 4, "A" means that an LS pattern having a line width each shown in Table 4 was formed.

TABLE 4

| | 50 nm | 40 nm | 35 nm | 32 nm | 30 nm | 28 nm | 26 nm |
|---|---|---|---|---|---|---|---|
| Example 1 | A | A | A | A | A | A | A |
| Example 2 | A | A | A | A | A | A | A |
| Example 3 | A | A | A | A | A | A | A |

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist pattern forming method, comprising:

forming a resist film on a support by using a resist composition;

subjecting the resist film to exposure using an electron beam lithography device or an EUV exposure device; and forming a resist pattern by developing the resist film having undergone the exposure, wherein the developing is performed using a developer for lithography which contains (A) a basic compound represented by the following Formula (1) and (B) tetrabutylammonium hydroxide and in which the concentration of (A) is equal to or greater than 1.2% by mass and equal to or less than 1.7% by mass and the concentration of (B) is equal to or greater than 2.5% by mass and less than 2.8% by mass,

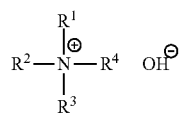
(1)

wherein $R^1$ to $R^4$ each independently represent a linear or branched alkyl group, and the total number of carbon atoms contained in the alkyl groups represented by $R^1$ to $R^4$ is 4 to 15.

2. A developer for lithography comprising:

(A) a basic compound represented by the following Formula (1); and (B) tetrabutylammonium hydroxide, wherein the concentration of (A) is equal to or greater than 1.2% by mass and equal to or less than 1.7% by mass, wherein the concentration of (B) is equal to or greater than 2.5% by mass and less than 2.8 by mass,

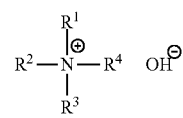
(1)

wherein $R^1$ to $R^4$ each independently represent a linear or branched alkyl group, and the total number of carbon atoms contained in the alkyl groups represented by $R^1$ to $R^4$ is 4 to 15.

* * * * *